US011189485B2

(12) United States Patent
Olsen et al.

(10) Patent No.: US 11,189,485 B2
(45) Date of Patent: Nov. 30, 2021

(54) STEAM OXIDATION INITIATION FOR HIGH ASPECT RATIO CONFORMAL RADICAL OXIDATION

(71) Applicant: Applied Materials, Inc., Santa Clara, CA (US)

(72) Inventors: Christopher S. Olsen, Fremont, CA (US); Taewan Kim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/836,351

(22) Filed: Mar. 31, 2020

(65) Prior Publication Data

US 2020/0227256 A1    Jul. 16, 2020

Related U.S. Application Data

(63) Continuation of application No. 15/417,969, filed on Jan. 27, 2017, now abandoned.
(Continued)

(51) Int. Cl.
*H01L 21/02* (2006.01)
*H01L 23/29* (2006.01)
*H01L 23/31* (2006.01)

(52) U.S. Cl.
CPC .... *H01L 21/02252* (2013.01); *H01L 21/0223* (2013.01); *H01L 21/02164* (2013.01);
(Continued)

(58) Field of Classification Search
CPC .................. H01L 21/02326; H01L 21/0223
See application file for complete search history.

(56) References Cited

U.S. PATENT DOCUMENTS 6,037,273 A    3/2000  Gronet et al.
6,114,258 A    9/2000  Miner et al.
(Continued)

FOREIGN PATENT DOCUMENTS

CN    101431023 A    5/2009
CN    103348456 A    10/2013
(Continued)

OTHER PUBLICATIONS

Chinese Office Action dated Dec. 4, 2020, for Chinese Patent Application No. 201710827129.3.
(Continued)

*Primary Examiner* — Moazzam Hossain
*Assistant Examiner* — Stanetta D Isaac
(74) *Attorney, Agent, or Firm* — Patterson + Sheridan, LLP (57) ABSTRACT

A substrate oxidation assembly includes: a chamber body defining a processing volume; a substrate support disposed in the processing volume; a plasma source coupled to the processing volume; a steam source fluidly coupled to the processing volume; and a substrate heater. A method of processing a semiconductor substrate includes: initiating conformal radical oxidation of high aspect ratio structures of the substrate comprising: heating the substrate; and exposing the substrate to steam; and conformally oxidizing the substrate. A semiconductor device includes a silicon and nitrogen containing layer; a feature formed in the silicon and nitrogen containing layer having an aspect ratio of at least 40:1; and an oxide layer on the face of the feature having a thickness in a bottom region of the silicon and nitrogen containing layer that is at least 95% of a thickness of the oxide layer in a top region.

20 Claims, 6 Drawing Sheets

Related U.S. Application Data (60) Provisional application No. 62/394,293, filed on Sep. 14, 2016.

(52) U.S. Cl.
CPC ...... *H01L 21/02326* (2013.01); *H01L 23/291* (2013.01); *H01L 23/3192* (2013.01)

(56) References Cited

U.S. PATENT DOCUMENTS

| | | |
|---|---|---|
| 6,159,866 A | 12/2000 | Gronet et al. |
| 6,399,490 B1 | 6/2002 | Jammy et al. |
| 6,410,456 B1 | 6/2002 | Gronet et al. |
| 6,461,948 B1 | 10/2002 | Rapp et al. |
| 7,159,599 B2 | 1/2007 | Verhaverbeke et al. |
| 7,541,297 B2 | 6/2009 | Mallick et al. |
| 7,585,686 B2 | 9/2009 | Verhaverbeke et al. |
| 7,674,727 B2 | 3/2010 | Yuan et al. |
| 7,713,881 B2 | 5/2010 | Paranjpe et al. |
| 7,794,544 B2 | 9/2010 | Nguyen et al. |
| 7,825,038 B2 | 11/2010 | Ingle et al. |
| 7,902,080 B2 | 3/2011 | Chen et al. |
| 7,943,531 B2 | 5/2011 | Nemani et al. |
| 8,119,210 B2 | 2/2012 | Narwankar et al. |
| 8,153,348 B2 | 4/2012 | Nemani et al. |
| 8,187,381 B2 | 5/2012 | Sangam et al. |
| 8,282,992 B2 | 10/2012 | Myo et al. |
| 8,343,279 B2 | 1/2013 | Myo et al. |
| 8,382,897 B2 | 2/2013 | Sangam et al. |
| 8,507,389 B2 | 8/2013 | Date et al. |
| 8,741,788 B2 | 6/2014 | Liang et al. |
| 8,871,656 B2 | 10/2014 | Mallick et al. |
| 9,117,661 B2 | 8/2015 | Yokota et al. |
| 9,147,573 B2 | 9/2015 | Tsubota |
| 9,236,242 B2 | 1/2016 | Ueda et al. |
| 9,297,073 B2 | 3/2016 | Li et al. |
| 2003/0075108 A1 | 4/2003 | Arghavani et al. |
| 2004/0265215 A1 | 12/2004 | DeCarli et al. |
| 2005/0005844 A1 | 1/2005 | Kitagawa et al. |
| 2009/0031953 A1 | 2/2009 | Ingle et al. |
| 2009/0065896 A1 | 3/2009 | Hwang |
| 2013/0078789 A1 | 3/2013 | Nakayama |
| 2014/0141542 A1 | 5/2014 | Kang et al. |
| 2014/0349491 A1 | 11/2014 | Tjandra et al. |
| 2015/0318146 A1 | 11/2015 | Kim |
| 2016/0099143 A1 | 4/2016 | Yan et al. |
| 2016/0201196 A1 | 7/2016 | Nabeta et al. |

FOREIGN PATENT DOCUMENTS

| | | |
|---|---|---|
| CN | 104752199 A | 7/2015 |
| CN | 105047527 A | 11/2015 |
| CN | 208336146 U | 1/2019 |
| CN | 209496853 U | 10/2019 |
| JP | H06-163523 A | 6/1994 |
| JP | H11-354516 A | 12/1999 |
| TW | 200834778 A | 8/2008 |
| TW | 200845147 A | 11/2008 |
| TW | 201233842 A | 8/2012 |
| TW | I433237 B | 4/2014 |
| TW | 201523694 A | 6/2015 |
| TW | 201824432 A | 7/2018 |

OTHER PUBLICATIONS

Chinese Office Action for Application No. 201721177346.4 dated Feb. 7, 2018.
Du, Honghua et al., Oxidation Studies of Crystalline CVD Silicon Nitride, J. Electrochem. Soc., vol. 136, No. 5, May 1989, pp. 1527-1536.
Green, M. L. et al., "Ultrathin (<4 nm) SiO2 and Si—O—N gate dielectric layers for silicon microelectronics: Understanding the processing, structure, and physical and electical limits," J. Appl. Phys. vol. 90, No. 5 (2001) pp. 2057-2121.
International Search Report and Written Opinion For Application No. PCT/US2017/015329 dated Jun. 14, 2017.
Kokusai Semiconductor Equipment Corporation, Gate Oxide [Plasma Nitridation] Brochure.
Letellier, Franck and Wardle, Dave, "Catalytic Steam Generation," Catalysis, 2010, pp. 54-55 (www.digitalrefining.com/article/1000473).
Li, Yunlong et al., "Production of a Large-Diameter Uniform Plasma by Modified Magnetron-Typed Radio Frequency Discharge," Jpn. J. Appl. Phys. vol. 36 (1996) pp. 4554-4557.
Spiegelman, Jeffery J., "Alternative Method for Steam Generation for Themal Oxidation of Silicon," Gases&Instrumentation, Jan./Feb. 2010, pp. 8-16.
Systonics, Technical Note No. 3, Pyrogenic Oxidation.
Taiwan Office Action issued in Application No. 106129462 dated Jun. 24, 2019.
Taiwan Search Report issued to Application No. 106129462 dated Feb. 11, 2019.
Tawian Office Action dated Jan. 21, 2020, for Taiwan Patent Application No. 106129462.
Terasaki, Tadashi et al. "MARORA"—A Plasma Selective-oxidation Apparatus for Metal-gate Devices, Hitachi Review Vo. 57 (2008), No. 3, pp. 127-131.
Chinese Office Action dated Feb. 2, 2021, for Chinese Patent Application No. 201710947719.X.
Taiwan Office Action dated Mar. 22, 2021, for Taiwan Patent Application No. 109119999.
Chinese Office Action dated Jul. 27, 2021, for Chinese Patent Application No. 201710947719.X.
Chinese Office Action dated Sep. 13, 2021, for Chinese Patent Application No. 201710827129.3.

STEAM OXIDATION INITIATION FOR HIGH ASPECT RATIO CONFORMAL RADICAL OXIDATION

CROSS-REFERENCE TO RELATED APPLICATIONS

This application is a continuation of co-pending U.S. patent application Ser. No. 15/417,969, filed Jan. 27, 2017, which claims benefit of U.S. Provisional Patent Application Ser. No. 62/394,293, filed Sep. 14, 2016. Each of the aforementioned related patent applications is herein incorporated by reference in its entirety.

BACKGROUND

Embodiments of the present invention generally relate to semiconductor device fabrication, and in particular to substrate oxidation chambers for conformal radical oxidation of high aspect ratio structures with steam oxidation initiation.

The production of silicon integrated circuits has placed difficult demands on fabrication steps to increase the number of devices while decreasing the minimum feature sizes on a chip. These demands have extended to fabrication steps including depositing layers of different materials onto difficult topologies and etching further features within those layers. This is especially an issue in the manufacturing of next generation NAND flash memory. NAND is a type of non-volatile storage technology that does not require power to retain data. To increase memory capacity within the same physical space, a three-dimensional NAND (3D NAND) design has been developed. Such a design typically introduces alternating oxide layers and nitride layers which are etched to produce a desired structure having one or more faces extending substantially perpendicularly to the substrate. Such design considerations have moved the field from oxidation of relatively low aspect ratio structures, for example 10:1 aspect ratios, to high aspect ratio (HAR) structures, for example 40:1 or greater aspect ratios. Prior fabrication steps have included methods for filling gaps and trenches in HAR structures.

3D NAND flash structures are often coated with silicon nitride ($SiN_x$) layers that are to be oxidized conformally in HAR structures. 3D NAND flash structures may have high or ultra-high aspect ratios, for example, a 40:1 aspect ratio, between a 40:1 and a 100:1 aspect ratio, a 100:1 aspect ratio, or even greater than 100:1 aspect ratio. New fabrication steps are required to conformally deposit layers on the faces of HAR structures, rather than simply filling gaps and trenches. For example, forming layers conformally onto the face of a HAR structure may require slower deposition rates. "Conformally" generally refers to uniform and/or constant-thickness layers on faces of structures. In the context of HAR structures, "conformally" may be most relevant when discussing the thickness of oxidation on the structure faces that are substantially perpendicular to the substrate. A more conformal deposition can reduce material build up at the top of the structure. Such material build up may result in material prematurely sealing off the top of the trench between adjacent structures, forming a void in the trench. Unfortunately, slowing the deposition rate also means increasing the deposition time, which reduces processing efficiency and production rates.

It would be beneficial to efficiently conformally oxidize HAR structures, examples of which include $SiN_x$ layers.

SUMMARY

In one embodiment, a substrate oxidation assembly includes: a chamber body defining a processing volume; a substrate support disposed in the processing volume; a plasma source coupled to the processing volume; a steam source fluidly coupled to the processing volume; and a substrate heater.

In one embodiment, a method of processing a semiconductor substrate includes: initiating conformal radical oxidation of high aspect ratio structures of the substrate comprising: heating the substrate; and exposing the substrate to steam; and conformally oxidizing the substrate.

In one embodiment, a semiconductor device includes a silicon and nitrogen containing layer; a feature formed in the silicon and nitrogen containing layer having: a face substantially perpendicular to a substrate; a bottom region; a top region farther from the substrate than the bottom region; and an aspect ratio of at least 40:1; and an oxide layer on the face of the feature, the oxide layer having a thickness in the bottom region that is at least 95% of a thickness of the oxide layer in the top region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

A substrate oxidation assembly may include a plasma source, for example a remote plasma source (RPS), and a processing chamber designed to perform atomic oxygen radical (O) growth (e.g., conformal radical oxidation) in high aspect ratio (HAR) structures, for example trench capacitor dielectrics, gate dielectrics, and 3D NAND flash structures. In some embodiments, the substrate oxidation assembly may utilize steam, such as water ($H_2O$) steam, to initiate radical oxidation of silicon nitride ($SiN_x$) material. The substrate oxidation assembly may be designed to initiate a reaction to form silicon oxynitride ($Si_2N_2O$) as an intermediary to forming silica ($SiO_2$). In some embodiments, the substrate oxidation assembly may include an external steam source, for example an ex-situ $H_2O$ steam source, such as an $H_2O$ injector, an ultrapure $H_2O$ injector, a catalytic steam generator, or a pyrogenic steam source. The steam source may be quartz lined. The steam source may be fluidly coupled to the processing chamber by a conduit, which may be quartz-lined. The plasma source may utilize an oxygen-containing gas such as a mixture of hydrogen ($H_2$) and oxygen ($O_2$) with $H_2$ concentration in the range of about 5% to about 10%. In some embodiments, the plasma source may be a RPS, magnetron typed plasma source, a Modified Magnetron Typed (MMT) plasma source, a remote plasma oxidation (RPO) source, a capacitively coupled plasma (CCP) source, an inductively coupled plasma (ICP) source, or a toroidal plasma source.

Figure 1A:
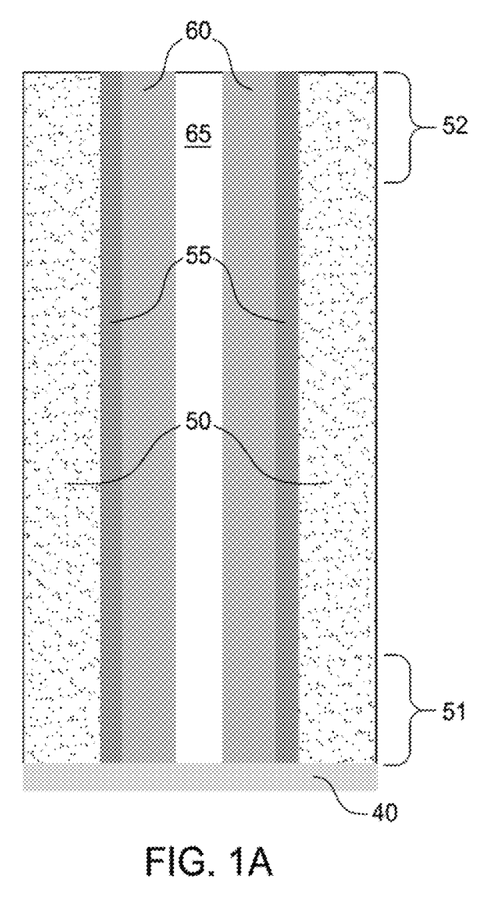
FIG. 1A illustrates a substrate with one or more $SiN_x$ HAR structures that have been oxidized, resulting in $Si_2N_2O$ and $SiO_2$ layers.

FIG. 1A illustrates a substrate 40 with one or more HAR structures 50, for example one or more $SiN_x$ structures that have been conformally oxidized, resulting in a conformal $SiO_2$ layer 60. Faces of the HAR structure 50 may be substantially perpendicular to the substrate 40. For example, faces of the HAR structure 50 may be at an angle of at least 60° to the substrate 40. In FIG. 1A, a $Si_2N_2O$ layer 55 is illustrated between the HAR structure 50 and the $SiO_2$ layer 60 on each face of the HAR structures. Note that a trench 65 remains between the $SiO_2$ layers 60 on each face of the HAR structure. Trench 65 may provide access to the faces of the HAR structures, for example for gas transmission and/or reactant removal. As aspect ratio increases, surface area of the HAR structures and the depth of the trenches likewise increase. As would be understood by one of ordinary skill in the art with the benefit of this disclosure, conformal radical oxidation of the faces of the HAR structures may be hampered by O depletion, especially near the bottom of the HAR structures, for example in bottom region 51.

It is currently believed that thermally-activated oxygen ($O_2$) molecules are thermodynamically unfavorable for oxidizing $SiN_x$ into the intermediate phase, $Si_2N_2O$ layer 55. However, once the intermediate phase, $Si_2N_2O$ layer 55, is formed, atomic oxygen provides high oxide growth rate and conformality on HAR structures, such as 3D NAND HAR memory trenches. Due to mass and energy transport challenges, O and hydroxyl (OH) is thought to be less thermodynamically favored to oxidize $SiN_x$ into the intermediate phase, $Si_2N_2O$ layer 55. Once the intermediate phase, $Si_2N_2O$ layer 55, is formed as the intermediator, then $SiO_2$ layer 60 may thermally grow in the presence of atomic oxygen.

Figure 1B:
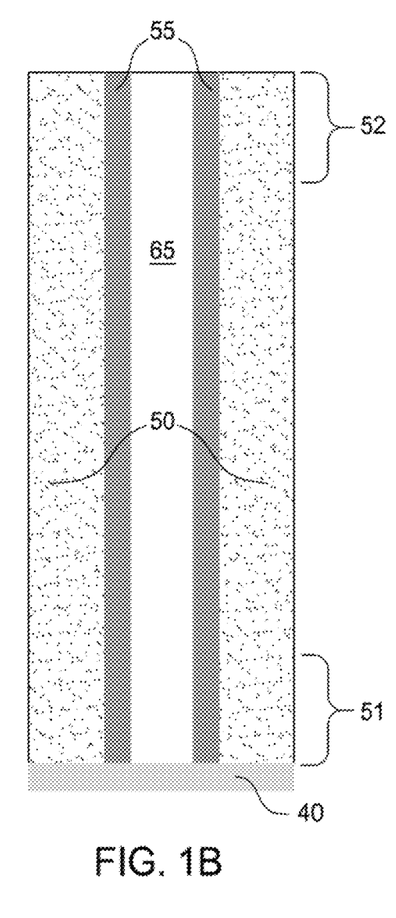
FIG. 1B illustrates generally uniform thickness of the $Si_2N_2O$ layer across the face of the HAR structure.
Figure 1C:
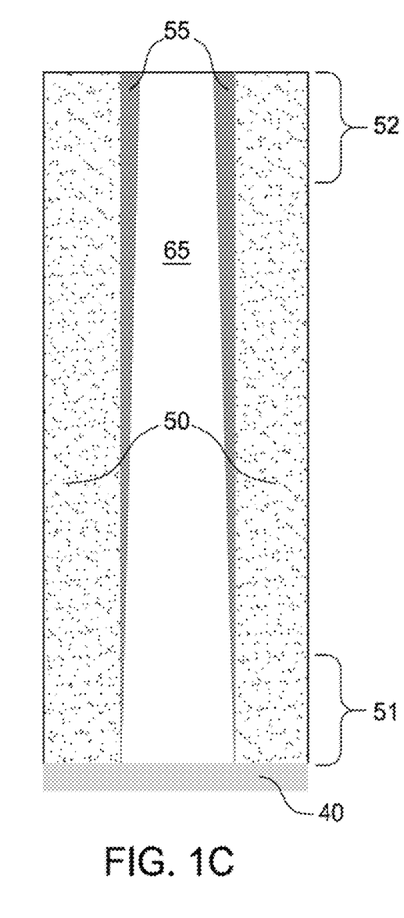
FIG. 1C illustrates the $Si_2N_2O$ layer formed non-uniformly.

Heretofore, it had been expected that oxidation of $SiN_x$ in HAR structures at temperatures below about 800° C. would have close to 100% conformality. As illustrated in FIG. 1A, it is currently believed that an intermediate reaction produces an intermediate phase, $Si_2N_2O$ layer 55, which then reacts with O radicals to form the $SiO_2$ layer 60. Therefore, for conformal radical oxidation of the HAR structure 50, the thickness of the $Si_2N_2O$ layer 55 should be generally uniform across the face of the HAR structure 50, as illustrated in FIG. 1B. However, recent research indicates that a metastable species, such as H or OH, may not form or appear near the bottom of trench 65, thereby lengthening the incubation times for the intermediate reaction in bottom region 51. For example, at a substrate temperature of about 700° C., in the presences of $O_2$, for HAR structures, the $Si_2N_2O$ layer 55 may form non-uniformly, as illustrated in FIG. 1C.

Figure 2:
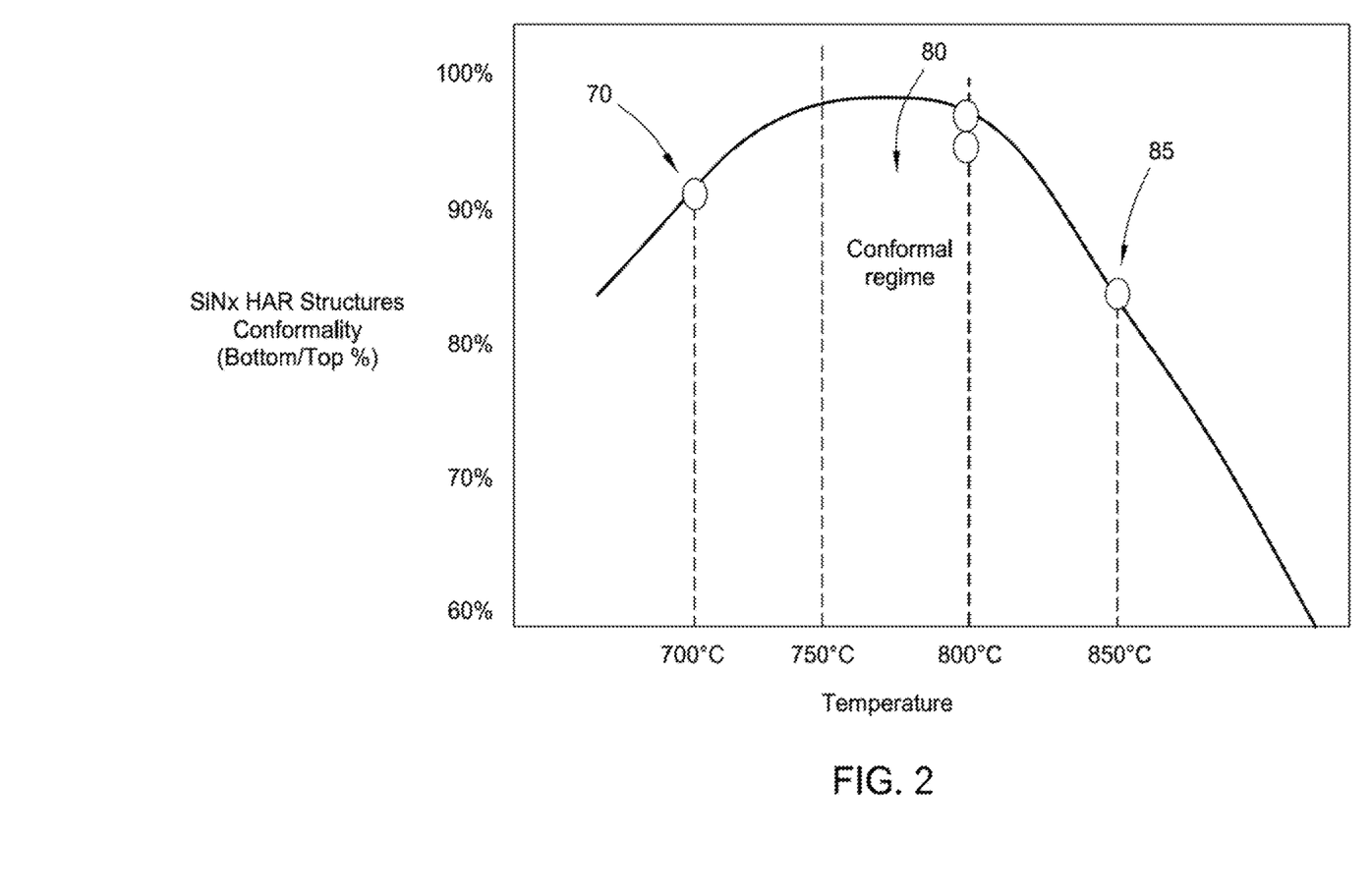
FIG. 2 illustrates a graph of Conformality vs Temperature for $SiN_x$ HAR structures.

The conformality of layers on HAR structures can be measured as a ratio of the bottom thickness (measured in bottom region 51, nearer to the substrate 40) to the top thickness (measured in top region 52, farther from the substrate 40), and when multiplied by 100 may be referred to as the "bottom/top %". In some experiments, the bottom/top % of the $Si_2N_2O$ layer 55 at a substrate temperature of about 700° C., as illustrated in FIG. 1C, is about 90%. This can also be seen at point 70 in the graph of Conformality vs Temperature in FIG. 2. It is also currently believed that, at substrate temperatures between about 750° C.-800° C., in the presence of $O_2$, for HAR structures, the rate of $O_2$ depletion allows the $Si_2N_2O$ layer 55 to grow slowly near the top, providing for a bottom/top % of close to 100%. This generally establishes conformal regime 80 (between about 750° C. and about 800° C.) in FIG. 2. It is also currently believed that, at higher substrate temperatures, such as 850° C. and above, in the presences of $O_2$, for HAR structures, the rate of $O_2$ depletion allows the $Si_2N_2O$ layer 55 to grow rapidly near the top, resulting in a bottom/top % of between about 80% to about 90%. This can be seen at point 85 in FIG. 2.

Recent research indicates that a metastable species, such as H or OH, may not form near the bottom of trench 65, thereby lengthening the incubation times for the intermediate reaction in bottom region 51. It is currently believed that atomic oxygen has a high species lifetime in HAR structures. However, H radicals do not tend to have a long species lifetime. Therefore, H radicals are believed to carry-away nitrogen. In some embodiments, an ammonia (NH3) by-product may form.

With this new understanding of the incubation period for the intermediate reaction, it should be appreciated that the rate of $O_2$ depletion near the bottom may worsen as the aspect ratio increases. Therefore, even at substrate temperatures of about 800° C., it may be difficult or impossible to achieve conformal radical oxidation for higher aspect ratio structures. However, further raising the substrate temperature to improve the rate of O2 depletion may warp or otherwise damage HAR structures. Similar principles may be applicable to crystalline silicon (polysilicon), and aluminum oxide HAR structures.

Figure 3:
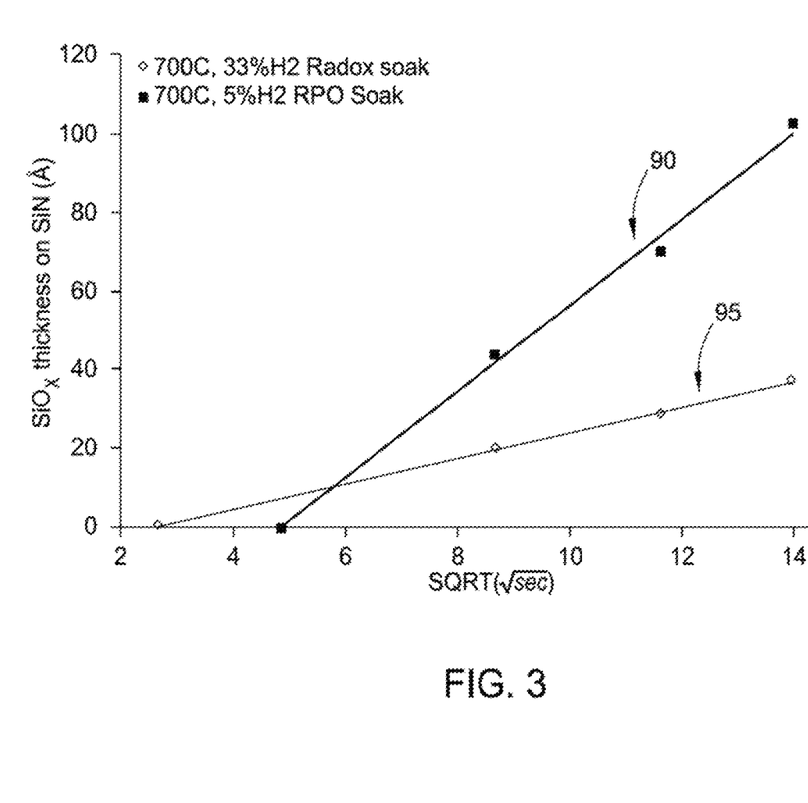
FIG. 3 illustrates a graph of $SiO_x$ thickness as a function of square root of time for $SiN_x$ HAR structures.

As illustrated in FIG. 3, the incubation period for the intermediate reaction may decrease in the presence of steam. The data presented in FIG. 3 shows at line 90 the $SiO_x$ thickness as a function of square root of time for $SiN_x$ HAR structures at 700° C. substrate temperature in the presence of 5% $H_2$ plasma, for example, during RPO. The line 90 crosses the x-axis at just under 5 $s^{1/2}$, indicating the initial growth of $SiO_x$. However, for the same $SiN_x$ HAR structures in the presence of 33% $H_2$ and O radicals (as would be the case with steam), line 95 crosses the x-axis at about 2.5 $s^{1/2}$. Consequently, it can be inferred that the incubation period for the intermediate reaction favors steam, while the growth of the oxide layer following the intermediate reaction favors oxygen. Thermodynamic calculations suggest that steam is a preferable reactant to form $NH_3$ as by-product. O or OH is less favorable to form $Si_2N_2O$.

Figure 4:
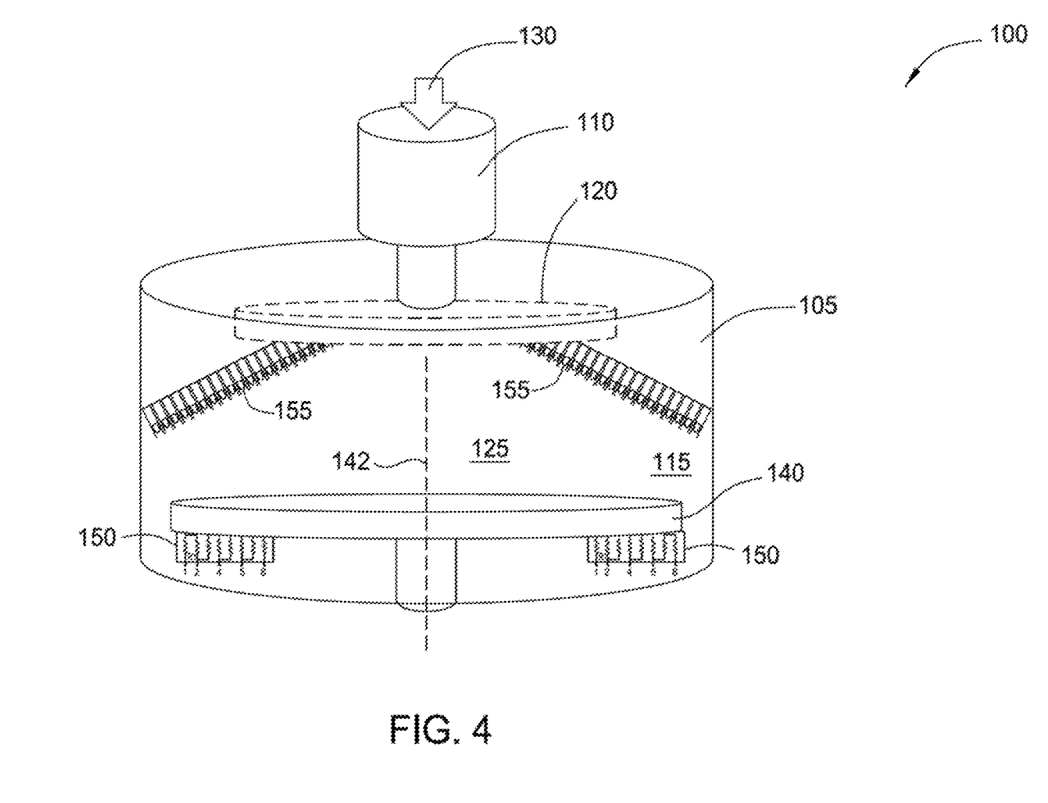
FIG. 4 illustrates a substrate oxidation assembly according to embodiments of this invention.

FIG. 4 illustrates a substrate oxidation assembly 100, having a chamber body 105 and a plasma source 110. The substrate oxidation assembly 100 may include, for example, a 3D NAND oxidation chamber. Plasma source 110 may be a RPS. The substrate oxidation assembly 100 may include, for example, a MMT plasma reactor, a RPO reactor, a CCP reactor, an ICP reactor, or a toroidal source plasma immersion ion implantation reactor. The substrate oxidation assembly 100 may include, additionally or instead, the plasma sources associated with each of the reactors above. The chamber body 105 may define a processing volume 115. The chamber body 105 may enclose a processing volume in which O and OH are used to process substrates, and the pressure of the processing volume may be maintained between about 0.5 Torr and 1 Torr to allow for plasma expansion and/or for uniform oxidation at the substrate. In some embodiments, the pressure may be maintained between about 10 mTorr and about 500 mTorr. In some embodiments, the pressure may be maintained between about 1 Torr and about 5 Torr. The plasma source 110 may utilize an oxygen-containing gas source 130, such as a mixture of $H_2$ and $O_2$, with a concentration of $H_2$ in the range of about 5% to about 10%. In some embodiments, the gas provided by the gas source 130 can be, for example, a gas that provides $H_2$ and, optionally, other essentially non-reactive elements, such as nitrogen or the like. The plasma source 110 may operate at a power of about 5 kW. The chamber body 105 may have a total volume of between about 30 liters and about 60 liters. The diameter of the cross-sectional area of the chamber may be about 20 inches. In one embodiment, plasma source 110 may be coupled to the chamber body 105 through a gas port to supply reactive plasma from the plasma source 110 through a gas distributor 120, such as a shower head, to the processing volume 115. Gas distributor 120 may have, for example, one or more outlet ports facing substrate support 140. It is noted that the plasma source 110 may be coupled to the chamber body 105 in any suitable position to supply a reactive plasma to a substrate as needed.

The chamber body 105 may contain a substrate support 140 disposed in the processing volume 115. The substrate support 140 may include any technically feasible apparatus for supporting a substrate during processing. The chamber body 105 may contain a substrate heater. For example, in some embodiments, the substrate support 140 is in contact with one or more heating elements 150 (or arrays of heating elements) for conductive heating of the substrate during processing. The heating elements 150 may be electric resistance heating devices, inductive heating devices, or hot fluid conduits. In some embodiments, chamber body 105 contains one or more lamps 155 (or arrays of lamps) for radiative heating of the substrate during processing. In some embodiments, the heating elements 150 and/or lamps 155 may heat the substrate support to a temperature range of between about 700° C. and about 900° C. Temperature may be controlled through sensors (not shown) disposed in the chamber body 105 and connected to a temperature controller (not shown) that varies power to the substrate heater. The substrate support 140 may have a cross-sectional area of about 70 $mm^2$. The substrate support 140 may be sized to provide a "rim" around the edge of a substrate. For example, the substrate support 140 may be circular and have a diameter of about 300 mm. In some embodiments, the substrate support 140 may have a diameter between about 10 mm to about 40 mm larger than that of an expected substrate. Likewise, heating elements 150 may be sized to provide a larger cross-sectional area than the substrate support 140. In some embodiments, heating elements 150 may be circular and have a diameter of between about 320 mm and about 350 mm. The plasma source 110 may be arranged to be coaxial with a line 142 perpendicular to, and through a center of, a substrate supporting surface of the substrate support 140, which may be called an "axis" of the substrate support 140. Likewise, the gas distributor 120 may be arranged to be coaxial with the axis 142 of the substrate support 140. A plasma volume 125 may be defined between the gas distributor 120 and the substrate support 140 in the processing volume 115. The plasma volume 125 may be coupled to the plasma source 110. The components of the substrate oxidation assembly 100 may be arranged to allow for gas diffusion across the surface of the substrate facing away from the substrate support 140. For example, the gas may enter the processing volume 115 at a point along the axis 142 of the substrate support, and between about 5 inches to about 6 inches away from (e.g., above) the substrate surface. The gas may thereby flow across the surface of a substrate on the substrate support 140.

Figure 5:
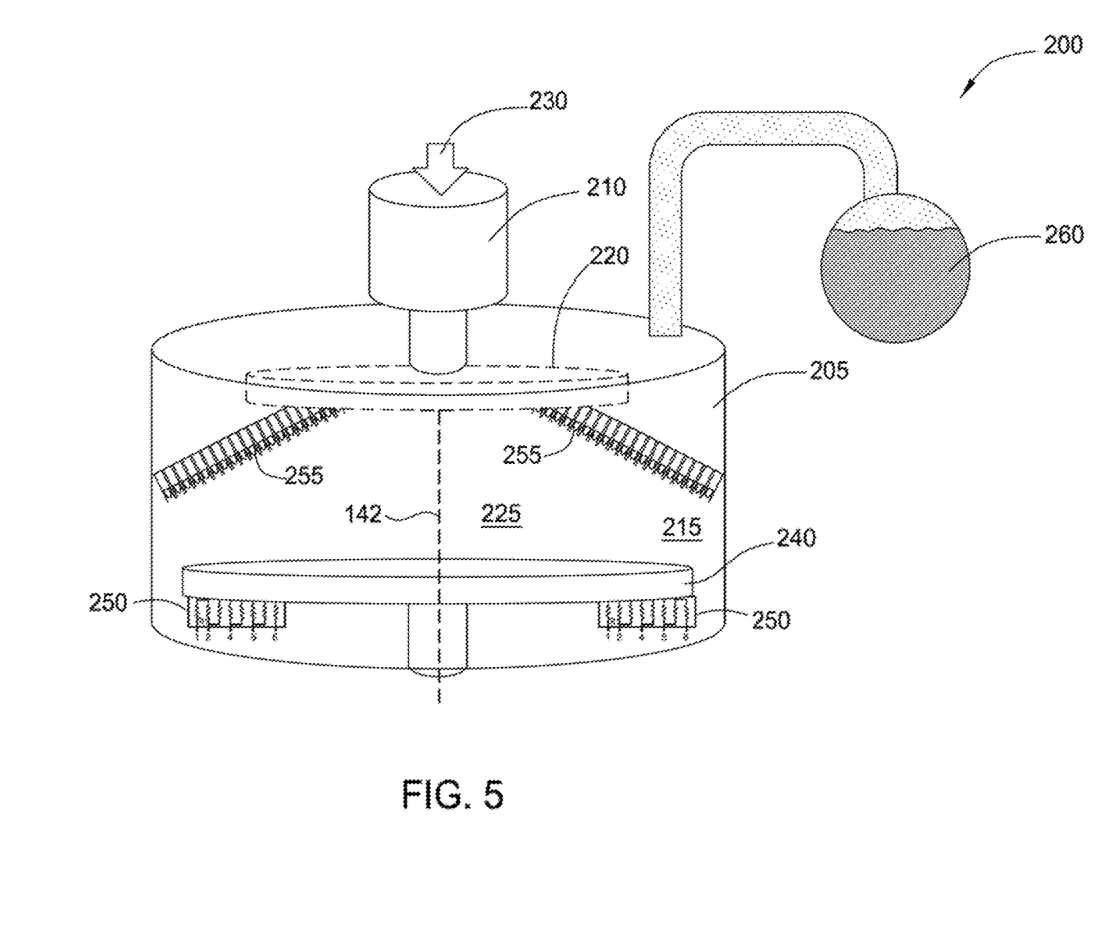
FIG. 5 illustrates a substrate oxidation assembly according to embodiments of this invention.

FIG. 5 illustrates a substrate oxidation assembly 200 with a chamber body 205, a plasma source 210, and a steam source 260, such as an ex-situ $H_2O$ steam source. Unless otherwise stated, substrate oxidation assembly 200 is configured similarly to substrate oxidation assembly 100. The chamber body 205 may enclose a processing volume 215, and a substrate support 240 may be disposed in the processing volume 215. The plasma source 210 may be coupled to an oxygen-containing gas source 230, which may contain a mixture of $H_2$ and $O_2$ with a concentration of $H_2$ in the range of about 5% to about 10%. In some embodiments, the chamber body 205 may include a gas distributor 220, such as a shower head. Gas distributor 220 may have, for example, one or more outlet ports facing substrate support 240. A plasma volume 225 may be between the gas distributor 220 and the substrate support 240 in the processing volume 215. The plasma volume 225 may be coupled to the plasma source 210 for forming a plasma in, or providing a plasma to, the plasma volume 225. The chamber body 205 may enclose a substrate heater, for example in the processing volume 215. In some embodiments, the substrate support 240 includes one or more heating elements 250 (or arrays of heating elements) for conductive heating of the substrate during processing. In some embodiments, chamber body 205 encloses one or more lamps 255 (or arrays of lamps) for radiative heating of the substrate during processing.

Steam source 260 may be an external steam source, for example, an $H_2O$ injector, an ultrapure $H_2O$ injector, a catalytic steam generator, or a pyrogenic steam source. The steam source 260 may be quartz-lined. In some embodiments, the steam source 260 may be fluidly coupled to the processing volume 215 by a conduit, which may be quartz-lined. Steam source 260 may be fluidly coupled to the processing volume 215 to distribute steam across the surface of the substrate support 240 and/or around the axis 142 of the substrate support 240. In some embodiments, the steam may be distributed symmetrically around the axis 142 of the substrate support 240. The steam source 260 is coupled to an inlet of chamber body 205, and the plasma volume 225 may be between the inlet and the substrate support 240. In some embodiments, steam source 260 may be fluidly coupled to gas distributor 220. For example, gas distributor 220 may have one or more inlet ports, and steam source 260 may fluidly couple to the one or more inlet ports. In some embodiments, the steam source 260 may be a catalytic steam generator. The catalytic steam generator may generate ultra-high purity $H_2O$ vapor by means of a catalytic reaction of $O_2$ and $H_2$. The catalytic steam generator may generate the vapor at low temperatures (e.g., <500° C.) by exposing a hydrogen source gas, for example $H_2$, and an oxygen source gas, for example $O_2$, to a catalyst. The catalytic steam generator may have a catalyst-lined reactor or a catalyst cartridge in which $H_2O$ vapor is generated by means of a chemical reaction. The catalyst contained within a catalyst reactor may include a metal or alloy, such as palladium, platinum, nickel, iron, chromium, ruthenium, rhodium, alloys thereof or combinations thereof. Regulating the flow of hydrogen source gas and oxygen source gas may allow the concentration to be precisely controlled at any point from 1% to 100% concentrations. In some embodiments, the ratio of $O_2$ to $H_2$ is between about 14:20 to about 21:20, or about 21:20. The $H_2O$ vapor may contain $H_2O$, $H_2$, $O_2$ and combinations thereof. In some embodiments, the steam may contain at least 30% $H_2$. In some embodiments, the concentration of components of the steam and any carrier gas are selected to reduce the presence of O in the processing volume during the incubation period. In some embodiments, the steam source 260 may be a pyrogenic generator. The pyrogenic generator may produce $H_2O$ vapor as a result of ignition, often at temperatures over 1,000° C.

In some embodiments, substrates having HAR structures may be loaded into a chamber body in the presence of nitrogen. The substrates may be initially heated by a substrate heater. During the initial heating, the substrate may be exposed to oxygen, nitrogen, or a combination thereof. In some embodiments, the substrate heater may be a conductive heater, such as a resistive heater, in contact with a substrate support. The conductive heater may operate in a temperature range of between about 700° C. and about 900° C. In some embodiments, the substrate heater may be a radiative heater, such as one or more lamps directed at the substrate. It should be apparent that the substrate temperature may be somewhat less than that of the substrate heater. For example, the substrate temperature may be cooler than the substrate heater by about 100° C. to about 200° C. In some embodiments, the substrate temperature may be between about 500° C. and about 700° C., even after 60 seconds or more of heating. In some embodiments, after the initial heating the substrate temperature may be between about 750° C. and about 800° C. In some embodiments, the walls of the chamber body may be maintained at a temperature around 50° C. The initial heating may proceed for a predetermined time (e.g., between about 60 seconds and 120 seconds) and/or until a measurement of substrate temperature returns a desired reading. For example, initial heating may proceed until the substrate temperature measures to be at least 600° C. The substrate temperature may be measured, for example, by a pyrometer or a quartz thermocouple.

Once the initial heating has been completed, steam oxidation may initiate conformal radical oxidation of the substrate. Steam may be introduced into the chamber body. Steam may be introduced in combination with a carrier gas, for example $O_2$ or an inert gas, such as nitrogen or argon. Steam may be introduced at a partial pressure of about 50 Torr or less. The substrate heater may continue to heat the substrate during the steam exposure. The substrate may be exposed to steam for a predetermined time (e.g., between about 5 seconds and about 45 seconds). The steam may initiate an intermediate reaction on the face of the HAR structures. For example, $Si_2N_2O$ may form on the face of the $SiN_x$ structures in the presence of steam. In some embodiments, $Si_2N_2O$ may form conformally on the face of the $SiN_x$ structures in the presence of steam.

Once the steam exposure has been completed, the chamber body may be purged. The substrate may then be exposed to plasma, for example from a RPS. The substrate heater may continue to heat the substrate during the plasma exposure. The plasma may conformally oxidize the HAR structures. For example, $SiO_2$ may form on the face of the $SiN_x$ structures in the presence of plasma. A layer of $Si_2N_2O$ may remain between the face of the $SiN_x$ structures and the $SiO_2$.

Figure 6:
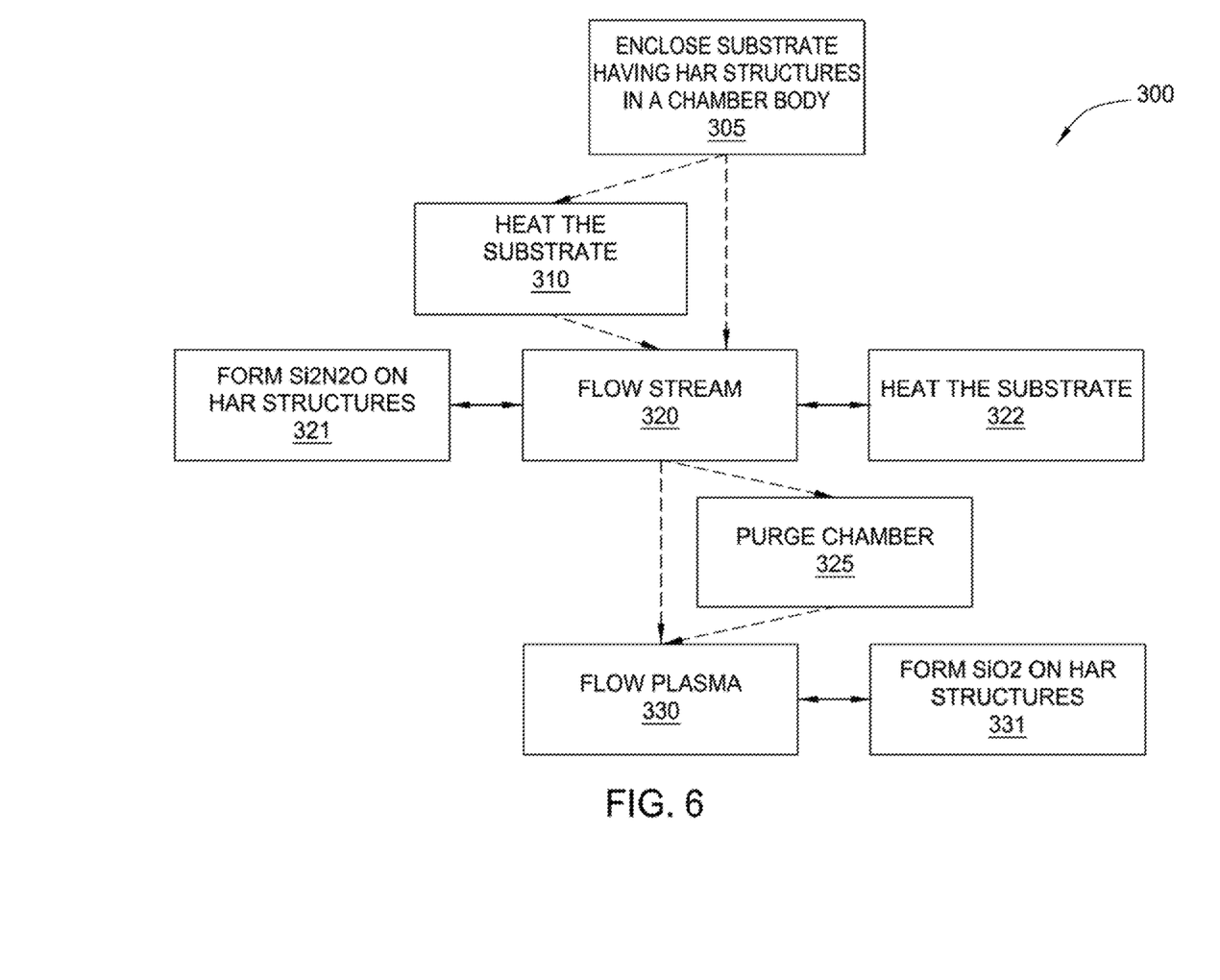
FIG. 6 illustrates a method of substrate processing according to embodiments of this invention.

As illustrated in FIG. 6, a method 300 is described with respect to the illustrative structures depicted in FIGS. 4 and 5. The method 300 generally begins at step 305, by enclosing a substrate having HAR structures in a chamber body. The substrate may include any material suitable for fabrication of the type of memory device (e.g., a 3D NAND flash memory device) identified above, for example, such as crystalline silicon, strained silicon, silicon germanium, doped or undoped polysilicon, doped or undoped silicon wafers, patterned or non-patterned wafers, silicon on insulator (SOI), carbon doped silicon oxides, doped silicon, or the like. The method 300 may then include, at step 310, initially heating the substrate. In some embodiments, step 310 may be skipped, and the method 300 may proceed directly to step 320, flowing steam into the chamber body for a time period, for example, between about 5 seconds and about 45 seconds. The time period may decrease as the temperature of the substrate increases. The steam may be generated externally to a chamber body in which the substrate is disposed. The steam may then be flowed into the chamber body and/or across the surface of the substrate. While the steam is flowing, the pressure in the chamber may be between about 0.5 Torr and about 100 Torr. The steam may be mixed with a carrier gas, for example $O_2$ or an inert gas, such as nitrogen or argon. The steam may initiate an intermediate reaction on the face of the HAR structures. For example, at step 321 the $Si_2N_2O$ may form on the face of the $SiN_x$ structures in the presence of steam. The substrate may be heated at step 322 while the steam is flowing. Optionally, the method may include at step 325 purging the chamber following flowing the steam. The method may then include at step 330 flowing plasma into the chamber body for a time period. The plasma may flow from a plasma source, such as a RPS, coupled to a precursor gas source. The plasma may include $O_2$ at a concentration of about 95% and H at a concentration of about 5%. The pressure of the plasma may be about 1 Torr to about 5 Torr. The plasma may conformally oxidize the HAR structures. For example, at step 331 $SiO_2$ may form on the face of the $SiN_x$ structures in the presence of plasma.

In one embodiment, a substrate oxidation assembly includes: a chamber body defining a processing volume; a substrate support disposed in the processing volume; a plasma source coupled to the processing volume; a steam source fluidly coupled to the processing volume; and a substrate heater.

In one or more embodiment disclosed herein, the substrate oxidation assembly further includes a quartz-lined conduit fluidly coupling the steam source to the processing volume.

In one or more embodiment disclosed herein, the steam source is quartz-lined.

In one or more embodiment disclosed herein, the processing volume includes a plasma volume, and the plasma source is coupled to the plasma volume.

In one or more embodiment disclosed herein, the steam source is coupled to an inlet of the chamber body, and the plasma volume is between the inlet and the substrate support.

In one or more embodiment disclosed herein, the substrate oxidation assembly further includes a gas distributor coupled to the chamber body, wherein: the gas distributor has one or more inlet ports, the steam source is fluidly coupled to the one or more inlet ports, and the gas distributor has one or more outlet ports facing the substrate support.

In one or more embodiment disclosed herein, the processing volume includes a plasma volume, the plasma source is coupled to the plasma volume; and the plasma volume is between the gas distributor and the substrate support.

In one or more embodiment disclosed herein, the substrate oxidation assembly further includes a gas distributor coupled to the chamber body, wherein: the gas distributor has one or more inlet ports, and the steam source is fluidly coupled to the one or more inlet ports by a quartz-lined conduit.

In one or more embodiment disclosed herein, the plasma source includes at least one of a remote plasma source, magnetron typed plasma source, a Modified Magnetron Typed plasma source, a remote plasma oxygen source, a capacitively coupled plasma source, an inductively coupled plasma source, and a toroidal plasma source.

In one or more embodiment disclosed herein, the substrate oxidation assembly further includes an oxygen-containing gas source fluidly coupled to the plasma source.

In one or more embodiment disclosed herein, the oxygen-containing gas contains 5% to 10% hydrogen.

In one or more embodiment disclosed herein, the steam source includes at least one of an $H_2O$ injector, an ultrapure $H_2O$ injector, a catalytic steam generator, and a pyrogenic steam source.

In one or more embodiment disclosed herein, the substrate oxidation assembly further includes at least one of a radiative heating source and a conductive heating source operatively coupled to the substrate support.

In one or more embodiment disclosed herein, the substrate heater is capable of heating to between 700° C. and 1100° C.

In one or more embodiment disclosed herein, the chamber is capable of conformal radical oxidation of high aspect ratio structures.

In one or more embodiment disclosed herein, after conformal radical oxidation, a thickness of a silicon dioxide layer in a bottom region of the high aspect ratio structures is between 95% and 105% of a thickness of a silicon dioxide layer in a top region of the high aspect ratio structures.

In one or more embodiment disclosed herein, the high aspect ratio structures have an aspect ratio of at least 40:1.

In one or more embodiment disclosed herein, the high aspect ratio structures comprise at least one of silicon nitride, crystalline silicon, or aluminum oxide.

In one or more embodiment disclosed herein, the high aspect ratio structures comprise 3D NAND structures.

In one embodiment, a method of processing a semiconductor substrate includes: initiating conformal radical oxidation of high aspect ratio structures of the substrate comprising: heating the substrate; and exposing the substrate to steam; and conformally oxidizing the substrate.

In one or more embodiment disclosed herein, the method further includes, before the initiating conformal radical oxidation of the high aspect ratio structures, loading the substrate into a chamber body in the presence of nitrogen.

In one or more embodiment disclosed herein, the method further includes, before the initiating conformal radical oxidation of the high aspect ratio structures, initially heating the substrate.

In one or more embodiment disclosed herein, the method further includes, while initially heating the substrate, exposing the substrate to at least one of oxygen, nitrogen, and a combination thereof.

In one or more embodiment disclosed herein, the initially heating the substrate comprises operating a conductive heater at a temperature between 700° C. and 900° C. while the conductive heater is in contact with a substrate support.

In one or more embodiment disclosed herein, the initially heating the substrate continues for at least 60 seconds.

In one or more embodiment disclosed herein, the initially heating the substrate continues until a temperature of the substrate is at least 600° C.

In one or more embodiment disclosed herein, after the initially heating the substrate, a temperature of the substrate is between 750° C. and 800° C.

In one or more embodiment disclosed herein, heating the substrate comprises: conductively heating the substrate support to a temperature between about 700° C. and 900° C. with an electric resistance heating device.

In one or more embodiment disclosed herein, the method further includes, while heating the substrate, exposing the substrate to oxygen or nitrogen.

In one or more embodiment disclosed herein, the method further includes, while exposing the substrate to steam, heating the substrate.

In one or more embodiment disclosed herein, the method further includes, while exposing the substrate to steam, maintaining a temperature of the substrate between 750° C. and 800° C.

In one or more embodiment disclosed herein, the exposing the substrate to steam lasts between 5 seconds and 45 seconds.

In one or more embodiment disclosed herein, the steam comprises at least 30% H2.

In one or more embodiment disclosed herein, the exposing the substrate to steam comprises: generating steam with a steam source external to a processing chamber, wherein the substrate is contained in the processing chamber; and flowing the steam into the processing chamber.

In one or more embodiment disclosed herein, the generating steam includes catalytic steam generation.

In one or more embodiment disclosed herein, the flowing the steam includes providing a symmetrical distribution of steam around an axis of a substrate support in the processing chamber.

In one or more embodiment disclosed herein, exposing the substrate to steam comprises mixing the steam with at least one of a carrier gas, oxygen, nitrogen, argon, an inert gas, and a combination thereof.

In one or more embodiment disclosed herein, the method further includes, after the initiating conformal radical oxidation of the high aspect ratio structures, exposing the substrate to plasma.

In one or more embodiment disclosed herein, the method further includes, after the initiating conformal radical oxidation of the high aspect ratio structures, and before the exposing the substrate to plasma, purging a chamber body containing the substrate.

In one or more embodiment disclosed herein, after the exposing the substrate to plasma, a thickness of a silicon dioxide layer in a bottom region of the high aspect ratio structures is between 95% and 105% of a thickness of the silicon dioxide layer in a top region of the high aspect ratio structures.

In one or more embodiment disclosed herein, after the exposing the substrate to plasma, a trench in the high aspect ratio structures remains unfilled.

In one or more embodiment disclosed herein, the method further includes, while exposing the substrate to plasma, heating the substrate.

In one or more embodiment disclosed herein, the method further includes forming the plasma from an oxygen-containing gas.

In one or more embodiment disclosed herein, the oxygen-containing gas contains 5% to 10% hydrogen.

In one or more embodiment disclosed herein, the high aspect ratio structures have an aspect ratio of at least 40:1.

In one or more embodiment disclosed herein, the high aspect ratio structures comprise at least one of silicon nitride, crystalline silicon, or aluminum oxide.

In one or more embodiment disclosed herein, the high aspect ratio structures comprise 3D NAND structures.

In one or more embodiment disclosed herein, the substrate is disposed in a processing chamber; and the exposing the substrate to steam comprises: flowing the steam and a carrier gas into the processing chamber for a first duration; discontinuing the flow of steam while continuing the flow of the carrier gas for a second duration; and flowing the steam and the carrier gas into the processing chamber for a third duration.

In one embodiment, a semiconductor device includes a silicon and nitrogen containing layer; a feature formed in the silicon and nitrogen containing layer having: a face substantially perpendicular to a substrate; a bottom region; a top region farther from the substrate than the bottom region; and an aspect ratio of at least 40:1; and an oxide layer on the face of the feature, the oxide layer having a thickness in the bottom region that is at least 95% of a thickness of the oxide layer in the top region.

In one or more embodiment disclosed herein, the semiconductor device comprises at least one of a memory device, a 3D NAND flash memory device, a crystalline silicon, a strained silicon, a silicon germanium, a doped polysilicon, an undoped polysilicon, a doped silicon wafer, an undoped silicon wafer, a patterned wafer, a non-patterned wafer, a silicon on insulator, a carbon doped silicon oxides, a doped silicon, or combinations thereof.

While the foregoing is directed to embodiments of the present invention, other and further embodiments of the invention may be devised without departing from the basic scope thereof, and the scope thereof is determined by the claims that follow.

What is claimed is:

1. A method of processing a semiconductor substrate comprising:
   treating high aspect ratio structures of the substrate by:
      conductively heating the substrate support to a temperature of about 700° C. and 900° C. with an electric resistance heating device; and
      introducing steam from a steam source via a first conduit to expose the substrate to steam; and
   introducing oxygen radicals from a remote plasma source via a second conduit to conformally oxidize the substrate to form a conformal silicon dioxide layer on a surface of the high aspect ratio structures.

2. The method of claim 1, further comprising, before the treating of the high aspect ratio structures, initially heating the substrate.

3. The method of claim 2, further comprising, while initially heating the substrate, exposing the substrate to at least one of: oxygen, nitrogen, and a combination thereof.

4. The method of claim 2, wherein the initially heating the substrate comprises operating a conductive heater at a temperature between 700° C. and 900° C. while the conductive heater is in contact with a substrate support.

5. The method of claim 2, wherein the initially heating the substrate continues for at least 60 seconds.

6. The method of claim 2, wherein the initially heating the substrate continues until a temperature of the substrate is at least 600° C.

7. The method of claim 2, wherein, after the initially heating the substrate, a temperature of the substrate is between 750° C. and 800° C.

8. The method of claim 1, further comprising: while heating the substrate, exposing the substrate to oxygen or nitrogen.

9. The method of claim 1, further comprising: while exposing the substrate to steam, maintaining a temperature of the substrate between 750° C. and 800° C.

10. The method of claim 1, wherein the exposing the substrate to steam lasts between 5 seconds and 45 seconds.

11. The method of claim 1, wherein the steam comprises at least 30% $H_2$.

12. The method of claim 1, wherein the exposing the substrate to steam comprises:
    generating steam with the steam source external to a processing chamber, wherein the substrate is contained in the processing chamber;
    generating plasma with the remote plasma source coupled to the processing chamber; and
    flowing the steam through the first conduit and the plasma through the second conduit into the processing chamber, wherein the first conduit is coupled to a first inlet of the processing chamber and the second conduit is coupled to a second inlet of the processing chamber.

13. The method of claim 12, wherein the flowing the steam includes providing a symmetrical distribution of steam around an axis of a substrate support in the processing chamber.

14. The method of claim 1, wherein exposing the substrate to steam comprises mixing the steam with at least one of a carrier gas, oxygen, nitrogen, argon, an inert gas, and a combination thereof.

15. A method of processing a semiconductor substrate comprising:
    treating high aspect ratio structures of the substrate by:
       conductively heating the substrate support to a temperature between about 700° C. and 900° C. with an electric resistance heating device and one or more lamps; and
       introducing steam from a steam source via a first conduit to expose the substrate to steam;
    conformally oxidizing the substrate; and
    introducing oxygen radicals from a remote plasma source via a second conduit after the treating of the high aspect ratio structures to expose the substrate to plasma.

16. The method of claim 15, further comprising: after the treating of the high aspect ratio structures, and before the exposing the substrate to plasma, purging a chamber body containing the substrate.

17. The method of claim 15, wherein, after the exposing the substrate to plasma, a thickness of a silicon dioxide layer in a bottom region of the high aspect ratio structures is between 95% and 105% of a thickness of the silicon dioxide layer in a top region of the high aspect ratio structures.

18. The method of claim 15, wherein, after the exposing the substrate to plasma, a trench in the high aspect ratio structures remains unfilled.

19. The method of claim 15, further comprising: forming the plasma from an oxygen-containing gas that contains 5% to 10% hydrogen.

20. A method of processing a semiconductor substrate comprising:
    treating high aspect ratio structures of the substrate, wherein:
       the high aspect ratio structures have an aspect ratio of at least 40:1;
       the high aspect ratio structures comprise at least one of silicon nitride, crystalline silicon, or aluminum oxide; and the treating comprises:
  conductively heating the substrate support to a temperature between about 700° C. and 900° C. with an electric resistance heating device;
  exposing the substrate to steam to form a conformal silicon oxynitride layer on a face of the high aspect ratio structures; and
oxidizing the substrate to form a conformal silicon dioxide layer over the conformal silicon oxynitride layer.

* * * * *